United States Patent
Lv et al.

(10) Patent No.: US 12,292,638 B2
(45) Date of Patent: May 6, 2025

(54) ARRAY SUBSTRATE AND MANUFACTURING METHOD, DISPLAY PANEL, AND DISPLAY DEVICE

(71) Applicants: Hefei Xinsheng Optoelectronics Technology Co., Ltd., Anhui (CN); BOE TECHNOLOGY GROUP CO., LTD., Beijing (CN)

(72) Inventors: Fengzhen Lv, Beijing (CN); Yongxian Xie, Beijing (CN); Zhixiang Zou, Beijing (CN); Chuanjiang Tang, Beijing (CN); Feng Qu, Beijing (CN); Tong Yang, Beijing (CN); Xiaoye Ma, Beijing (CN); Ran Zhang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/698,378

(22) PCT Filed: Oct. 15, 2021

(86) PCT No.: PCT/CN2021/124215
§ 371 (c)(1),
(2) Date: Apr. 4, 2024

(87) PCT Pub. No.: WO2023/060595
PCT Pub. Date: Apr. 20, 2023

(65) Prior Publication Data
US 2024/0393630 A1   Nov. 28, 2024

(51) Int. Cl.
*G02F 1/1333* (2006.01)
*G02F 1/1339* (2006.01)
(Continued)

(52) U.S. Cl.
CPC ...... *G02F 1/13338* (2013.01); *G02F 1/13394* (2013.01); *G02F 1/13398* (2021.01);
(Continued)

(58) Field of Classification Search
CPC ............. G02F 1/13338; G02F 1/13394; G02F 1/1345; G02F 1/13452; G02F 1/13456; G06F 3/0412
See application file for complete search history.

(56) References Cited

U.S. PATENT DOCUMENTS

2008/0024416 A1* 1/2008 Onogi ............... G02F 1/136286
345/87
2009/0066861 A1* 3/2009 Rho .................... G02F 1/13338
349/12

(Continued)

FOREIGN PATENT DOCUMENTS

| CN | 101004525 A | 7/2007 |
| CN | 101546070 A | 9/2009 |

(Continued)

OTHER PUBLICATIONS

International Search Report of PCT application No. PCT/CN2021/124215 dated Jun. 29, 2022.

(Continued)

*Primary Examiner* — Alexander P Gross
(74) *Attorney, Agent, or Firm* — Calfee, Halter & Griswold LLP

(57) ABSTRACT

An array substrate includes a base substrate, including a display area and a peripheral area; a driving circuit layer, located at one side of the base substrate and including a plurality of data lines and a plurality of scanning lines, where the plurality of data lines extend along a first direction and are arranged at intervals along a second direction, the plurality of scanning lines extend along the second direction (Continued)

and are arranged at intervals along the first direction, and the data line and the scanning line intersect with each other to define a plurality of sub-pixel areas; and a metal layer, located at one side of the driving circuit layer away from the base substrate, where the metal layer includes a plurality of metal blocks arranged at intervals, and the metal block is located at an intersection of the data line and the scanning line.

19 Claims, 9 Drawing Sheets

(51) Int. Cl.
  *G02F 1/1343* (2006.01)
  *G02F 1/1362* (2006.01)
  *H10D 86/40* (2025.01)
  *H10D 86/60* (2025.01)

(52) U.S. Cl.
  CPC .. *G02F 1/134336* (2013.01); *G02F 1/134345* (2021.01); *G02F 1/136286* (2013.01); *H10D 86/441* (2025.01); *H10D 86/60* (2025.01)

(56) References Cited

U.S. PATENT DOCUMENTS

| | | | | |
|---|---|---|---|---|
| 2011/0096279 | A1* | 4/2011 | Lee | G02F 1/13394 349/139 |
| 2016/0124280 | A1* | 5/2016 | Park | G02F 1/13394 438/151 |
| 2017/0153482 | A1* | 6/2017 | Miyamoto | G02F 1/1343 |
| 2017/0307933 | A1* | 10/2017 | Chen | G06F 3/0412 |
| 2021/0341804 | A1* | 11/2021 | Kuroe | G02F 1/13338 |

FOREIGN PATENT DOCUMENTS

| | | |
|---|---|---|
| CN | 105468202 A | 4/2016 |
| CN | 111025793 A | 4/2020 |
| JP | 2019174736 A | 10/2019 |

OTHER PUBLICATIONS

Written Opinion of PCT application No. PCT/CN2021/124215 dated Jun. 29, 2022.

* cited by examiner

ARRAY SUBSTRATE AND MANUFACTURING METHOD, DISPLAY PANEL, AND DISPLAY DEVICE

CROSS-REFERENCE TO RELATED APPLICATION

The present application is the U.S. National Stage of International Application No. PCT/CN2021/124215, filed on Oct. 15, 2021, the contents of which are incorporated herein by reference in their entireties for all purposes.

TECHNICAL FIELD

The present disclosure relates to the field of display technologies, and in particular to an array substrate, a manufacturing method of an array substrate, a display panel, and a display device.

BACKGROUND

A liquid crystal display (LCD) panel is typically formed by cell-assembling an array substrate and a color film substrate, and injecting liquid crystal between the two substrates.

In order to maintain a cell gap (cell thickness) between the array substrate and the color film substrate, a main method is to add a spacer having a certain thickness between the two substrates before the cell-assembling the two substrates to maintain the cell thickness. However, in the related art, the wiring on the array substrate is complex, resulting in uneven heights of the spacers on the array substrate.

The above information disclosed in the background section is only used for enhancing understanding of the background of the present disclosure, and thus it may include information that does not constitute prior art known to those ordinary skilled in the art.

SUMMARY

An object of the present disclosure is to provide an array substrate, a manufacturing method of an array substrate, a display panel, and a display device, and the array substrate helps to adjust flatness at an intersection position of a data line and a scanning line.

The present disclosure adopts the following technical solutions to achieve the above object of the invention.

According to a first aspect of the present disclosure, an array substrate is provided, and includes:
a base substrate, including a display area and a peripheral area located at a periphery of the display area;
a driving circuit layer, located at one side of the base substrate, and located in the display area, where the driving circuit layer includes a plurality of data lines and a plurality of scanning lines, the plurality of data lines extend along a first direction and are arranged at intervals along a second direction, the plurality of scanning lines extend along the second direction and are arranged at intervals along the first direction, the second direction intersects with the first direction, and the data line and the scanning line intersect with each other to define a plurality of sub-pixel areas; and
a metal layer, located at one side of the driving circuit layer away from the base substrate, and located in the display area, where the metal layer includes a plurality of metal blocks arranged at intervals, and the metal block is located at an intersection of the data line and the scanning line.

In an exemplary embodiment of the present disclosure, the metal layer further includes a plurality of touch control signal lines, an orthographic projection of the touch control signal line on the base substrate is located outside of an orthographic projection of the sub-pixel area on the base substrate, and the orthographic projection of the touch control signal line on the base substrate at least partially overlaps with an orthographic projection of the data line on the base substrate; and
the metal block includes a touch control connecting metal piece and a metal spacer piece, where the touch control connecting metal piece is connected to the touch control signal line, and the metal spacer piece is spaced apart from the touch control signal line.

In an exemplary embodiment of the present disclosure, the array substrate further includes:
a common electrode, located at the side of the driving circuit layer away from the base substrate, where the common electrode includes a plurality of touch control units arranged at intervals, and the touch control unit includes a plurality of interconnected common electrode blocks; and
a plurality of pixel electrodes, located at one side of the common electrode away from the base substrate; where the metal layer is located between the driving circuit layer and the common electrode, or is located at the side of the common electrode away from the base substrate; and
the touch control connecting metal piece includes a first touch control metal piece and a second touch control metal piece, where the touch control signal line is connected through the first touch control metal piece to one of the common electrode blocks in the touch control unit, the second touch control metal piece is not connected to the common electrode block, and the metal spacer piece is connected to the common electrode block through a via.

In an exemplary embodiment of the present disclosure, the touch control unit includes the plurality of common electrode blocks arranged in an array, at least two of the common electrode blocks are arranged along the first direction to form a column, and at least two of the common electrode blocks are arranged along the second direction to form a row;
two adjacent rows of the common electrode blocks in the touch control unit are connected to each other through a row connecting portion, and two adjacent columns of the common electrode blocks in the touch control unit are connected to each other through a column connecting portion; and
the column connecting portion includes an upper connecting part connected to an upper region of the common electrode block, and a lower connecting part connected to a lower region of the common electrode block.

In an exemplary embodiment of the present disclosure, the sub-pixel areas include a red sub-pixel area, a green sub-pixel area and a blue sub-pixel area, at least one red sub-pixel area, at least one green sub-pixel area and at least one blue sub-pixel area are arranged along the second direction to form a pixel unit region, and one pixel unit region corresponds to one of the common electrode blocks; and
an orthographic projection of the row connecting portion on the base substrate is located between orthographic projections, on the base substrate, of two adjacent sub-pixel areas corresponding to the common electrode block.

In an exemplary embodiment of the present disclosure, the common electrode block includes a main body, and a first protruding portion and a second protruding portion that are connected to one side of the main body; the first protruding portion is connected to a middle part of the side of the main body, an orthographic projection of the first protruding portion on the base substrate is located between orthographic projections, on the base substrate, of two adjacent sub-pixel areas corresponding to the common electrode block, and the second protruding portion is connected to a corner of the main body;

the metal spacer piece includes a first spacer, where an orthographic projection of the first spacer on the base substrate at least partially overlaps with the first protruding portion, and the first spacer is connected to the first protruding portion through a via;

a number of the first protruding portion is multiple, and a part of first protruding portions are used as the row connecting portion when two adjacent rows of the common electrode blocks are connected; and an orthographic projection of the first touch control metal piece on the base substrate at least partially overlaps with an orthographic projection, on the base substrate, of the second protruding portion of the one of the common electrode blocks in the touch control unit, and the first touch control metal piece is connected to the second protruding portion through a via.

In an exemplary embodiment of the present disclosure, in the second direction, orthographic projections, on the base substrate, of a part of the data lines are located within orthographic projections of the touch control signal lines on the base substrate.

In an exemplary embodiment of the present disclosure, in the second direction, the touch control signal line has a width of 5.2-6.2 μm, and the data line has a width of 2.5-3.5 μm.

In an exemplary embodiment of the present disclosure, the metal spacer piece includes a first edge, a second edge and a third edge connected in sequence, the second edge and the third edge are located at one side, along the first direction, of the first edge and are parallel to the first edge, a distance between the second edge and the first edge is greater than a distance between the third edge and the first edge, and an orthographic projection, on the base substrate, of a connecting via of the metal spacer piece and the common electrode block is located between orthographic projections, on the base substrate, of the first edge and the second edge.

In an exemplary embodiment of the present disclosure, the metal spacer piece has a dimension of 16-17 μm in the second direction, the distance between the first edge and the second edge is 11.6-12.6 μm, and the distance between the first edge and the third edge is 9.2-10.2 μm.

In an exemplary embodiment of the present disclosure, the orthographic projection of the touch control signal line on the base substrate is located between orthographic projections, on the base substrate, of the red sub-pixel area and the blue sub-pixel area.

In an exemplary embodiment of the present disclosure, the driving circuit layer further includes:
  a gate layer, located at the side of the base substrate, where the scanning line is arranged in a same layer as the gate layer, the gate layer includes a gate, and the scanning line is connected to the gate;
  a gate insulating layer, located at one side of the gate layer away from the base substrate, where the gate insulating layer covers a surface of the gate layer;
  an active layer, located at one side of the gate insulating layer away from the base substrate; and
  a source-drain layer, including a source covering one end of the active layer, and a drain covering another end of the active layer, where the data line is arranged in a same layer as the source-drain layer, and the data line is connected to the drain.

In an exemplary embodiment of the present disclosure, an orthographic projection of the metal block on the base substrate covers a gap between orthographic projections, on the base substrate, of the source and the drain.

In an exemplary embodiment of the present disclosure, the array substrate further includes:
  a signal lead, located at the side of the base substrate, and located in the peripheral area, where the signal lead includes a data lead and a scanning lead, the data lead is connected to the data line and is arranged in a same layer as the data line, and the scanning lead is arranged in a same layer as the scanning line; and
  a touch control lead, located at the side of the base substrate, and located in the peripheral area, where the touch control lead is connected to the touch control signal line and is arranged in a same layer as the touch control signal line; where
  orthographic projections, on the base substrate, of the data lead, the scanning lead and the touch control lead at least partially overlap with each other.

In an exemplary embodiment of the present disclosure, the peripheral area includes a binding zone; and the array substrate further includes:
  a pad, located at the side of the base substrate, and located in the binding zone, where the pad includes a first pad, a second pad and a third pad; where
  the first pad is connected to the data lead, the first pad includes a first conductive layer and a second conductive layer, where the first conductive layer is arranged in the same layer as the data line, the second conductive layer is arranged in a same layer as the pixel electrode, and the second conductive layer is connected to the first conductive layer through a via;
  the second pad is connected to the scanning lead, the second pad includes a third conductive layer and a fourth conductive layer, where the third conductive layer is arranged in the same layer as the scanning line, the fourth conductive layer is arranged in the same layer as the pixel electrode, and the fourth conductive layer is connected to the third conductive layer through a via; and
  the third pad is connected to the touch control lead, the third pad includes a fifth conductive layer and a sixth conductive layer, where the fifth conductive layer is arranged in the same layer as the touch control signal line, the sixth conductive layer is arranged in the same layer as the pixel electrode, and the sixth conductive layer is connected to the fifth conductive layer through a via.

According to a second aspect of the present disclosure, a manufacturing method for an array substrate is provided, and includes:
  providing a base substrate, where the base substrate includes a display area and a peripheral area located at a periphery of the display area;
  forming a driving circuit layer at one side of the base substrate, where the driving circuit layer is located in the display area and includes a plurality of data lines and a plurality of scanning lines, the plurality of data lines extend along a first direction and are arranged at intervals along a second direction, the plurality of scanning lines extend along the second direction and are arranged at intervals along the first direction, the second direction intersects with the first direction, and the data line and the scanning line intersect with each other to define a plurality of sub-pixel areas; and forming a metal layer at one side of the driving circuit layer away from the base substrate, where the metal layer is located in the display area and includes a plurality of metal blocks arranged at intervals, and the metal block is located at an intersection of the data line and the scanning line.

According to a third aspect of the present disclosure, a display panel is provided, and includes:

the array substrate described in the first aspect;
a color film substrate, located at one side of the array substrate;
a plurality of spacers, located between the array substrate and the color film substrate, where the spacers are in one-to-one correspondence with the metal blocks, and at least half of an orthographic projection, on the base substrate, of a top end of the spacer is located within an orthographic projection of the metal block on the base substrate; and
a liquid crystal layer, located between the array substrate and the color film substrate.

In an exemplary embodiment of the present disclosure, the sub-pixel areas include a red sub-pixel area, a blue sub-pixel area and a green sub-pixel area; the spacer includes a main spacer part, and an orthographic projection of the main spacer part on the base substrate is located between orthographic projections, on the base substrate, of the red sub-pixel area and the blue sub-pixel area.

In an exemplary embodiment of the present disclosure, an orthographic projection of the spacer on the base substrate partially overlaps with a gap between orthographic projections, on the base substrate, of the source and the drain.

According to a fourth aspect of the present disclosure, a display device is provided, and includes the display panel described in the third aspect.

The array substrate provided by the present disclosure includes the base substrate, the driving circuit layer and the metal layer, where the metal layer includes a plurality of metal blocks arranged at intervals, and the metal block is located at the intersection of the data line and the scanning line. The metal block helps to adjust the flatness at the intersection position of the data line and the scanning line, causing that uniformity in height and stability in distribution positions of other structures are maintained when the other structures are formed at the positions of the metal blocks.

BRIEF DESCRIPTION OF THE DRAWINGS

The accompanying drawings herein are incorporated into and form a part of the specification, illustrate embodiments consistent with the present disclosure, and are used in conjunction with the specification to explain the principles of the present disclosure. Obviously, the accompanying drawings in the following description are only some of the embodiments of the present disclosure, and other accompanying drawings may be obtained from these drawings without creative labor for those ordinary skilled in the art.

Figure 1:
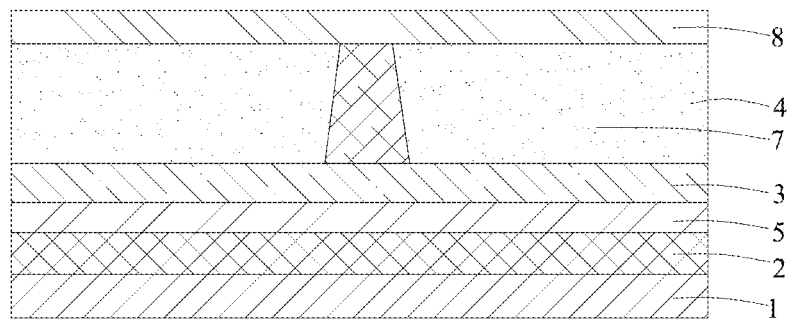
FIG. 1 is a schematic diagram of a cross-section of a display panel in an exemplary embodiment of the present disclosure.

Reference numerals of main components in the drawings are illustrated as follows.

1—base substrate; 11—display area; 12—peripheral area; 2—driving circuit layer; 21—scanning line; 22—data line; 23—source-drain layer; 23S—source; 23D—drain; 24—gate layer; 25—gate insulating layer; 26—active layer; 27—planarization layer; 3—metal layer; 31—metal block; 311—touch control connecting metal piece; 3111—first touch control metal piece; 3112—second touch control metal piece; 312—metal spacer piece; 312a—first edge; 312b—second edge; 312c—third edge; 312d—fourth edge; 312e—fifth edge; 3121—first spacer; 3122—second spacer; 32—touch control signal line; 4—spacer; 41—main spacer part; 42—secondary spacer part; 5—common electrode; 51—touch control unit; 511—common electrode block; 511a—main body; 511b—first protruding portion; 511c—second protruding portion; 512—row connecting portion; 513—column connecting portion; 5131—upper connecting part; 5132—lower connecting part; 501—first passivation layer; 502—second passivation layer; 6—pixel electrode; 7—liquid crystal layer; 8—color film substrate; 9—sub-pixel area; 90—pixel unit region; 91—red sub-pixel area;

92—green sub-pixel area; 93—blue sub-pixel area; 01—data lead; 02—scanning lead; 03—touch control lead; 04—first pad; 041—first conductive layer; 042—second conductive layer; 05—second pad; 051—third conductive layer; 052—fourth conductive layer; 06—third pad; 061—fifth conductive layer; 062—sixth conductive layer; 001—insulating layer; 002—insulating layer; 003—passivation layer; 004—passivation layer.

DETAILED DESCRIPTION

Exemplary embodiments are now described more comprehensively with reference to the accompanying drawings. However, the exemplary embodiments are capable of being implemented in a variety of forms and should not be construed as being limited to the examples set forth herein. Rather, the provision of these embodiments allows for the present disclosure to be more comprehensive and complete, and conveys the idea of the exemplary embodiments in a comprehensive manner to those skilled in the art. The described features, structures, or characteristics may be combined in one or more embodiments in any suitable manner. In the following description, many specific details are provided, thereby giving a full understanding of the embodiments of the present disclosure.

In the drawings, areas and thicknesses of layers may be exaggerated for clarity. The same reference numerals in the drawings indicate the same or similar structures, and thus their detailed descriptions will be omitted.

The described features, structures, or characteristics may be combined in one or more embodiments in any suitable manner. In the following description, many specific details are provided, thereby giving a full understanding of the embodiments of the present disclosure. However, those skilled in the art will realize that it is possible to practice the technical solutions of the present disclosure and omit one or more of the described particular details, or that other methods, components, materials, etc. may be used. In other cases, the well-known structures, materials, or operations are not shown or described in detail to avoid obscuring the main technical ideas of the present disclosure.

When a certain structure is "on" another structure, it may mean that the certain structure is integrally formed on another structure, or that the certain structure is "directly" provided on another structure, or that the certain structure is "indirectly" provided on another structure through yet another structure.

The terms "a", "an", and "the" are used for indicating an existence of one or more elements/components/etc.; and the terms "include" and "have" are used for indicating an open-ended inclusion and mean that there may be additional elements/components/etc. in addition to the listed elements/components/etc. The terms "first" and "second", etc. are used merely as markers and not as quantitative limitations to the objects thereof.

An array substrate of a liquid crystal display panel is typically provided with a variety of wirings, such as scanning lines and data lines. In the related art, in order not to affect the aperture ratio of the display panel, widths of the wirings such as the scanning lines and data lines are typically designed to be narrow, resulting in that the spacers located above the wirings are not uniform in height and not stable, thereby adversely affecting the cell thickness of the liquid crystal display panel and the like.

As shown in FIGS. 1 to 4, the present disclosure provides an array substrate that includes a base substrate 1, a driving circuit layer 2, and a metal layer 3. In some embodiments, the base substrate 1 includes a display area 11 and a peripheral area 12 located at a periphery of the display area 11. The driving circuit layer 2 is located at one side of the base substrate 1 and is located in the display area 11. The driving circuit layer 2 includes a plurality of data lines 22 and a plurality of scanning lines 21. The data line 22 and the scanning line 21 intersect with each other to define a plurality of sub-pixel areas 9. The metal layer 3 is located at one side of the driving circuit layer 2 away from the base substrate 1 and is located in the display area 11. The metal layer 3 includes a plurality of metal blocks 31 arranged at intervals. The metal block 31 is located at an intersection of the data line 22 and the scanning line 21.

The array substrate provided by the present disclosure includes the base substrate 1, the driving circuit layer 2 and the metal layer 3, where the metal layer 3 includes a plurality of metal blocks 31 arranged at intervals, and the metal block 31 is located at the intersection of the data line 22 and the scanning line 21. The metal block 31 helps to adjust the flatness at the intersection position of the data line 22 and the scanning line 21, causing that uniformity in height and stability in distribution positions of other structures are maintained when the other structures are formed at the positions of the metal blocks 31.

Various components of the array substrate provided by the embodiments of the present disclosure are described in detail below in conjunction with the accompanying drawings.

An embodiment of the present disclosure provides an array substrate, and the array substrate may be used for forming a thin film transistor liquid crystal display (TFT-LCD) panel.

As shown in FIGS. 1 to 4 and 7, the base substrate 1 includes the display area 11 and the non-display area 12 located at the periphery of the display area 11. The base substrate 1 may be a base substrate of an inorganic material or a base substrate of an organic material. For example, in an embodiment of the present disclosure, the material of the base substrate 1 may be a glass material such as soda-lime glass, quartz glass, sapphire glass, etc., or may be a metal material such as stainless steel, aluminum, nickel, etc. In another embodiment of the present disclosure, the material of the base substrate 1 may be a polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), polyethylene naphthalate (PEN), or a combination thereof. The base substrate 1 may also be a flexible base substrate. For example, in an embodiment of the present disclosure, the material of the base substrate 1 may be polyimide (PI). The base substrate 1 may also be a composite of multiple layers of materials. For example, in an embodiment of the present disclosure, the base substrate 1 may include a bottom film layer, a pressure-sensitive adhesive layer, a first polyimide layer, and a second polyimide layer that are stacked sequentially.

The driving circuit layer 2 is located at one side of the base substrate 1 and is located in the display area 11. The driving circuit layer 2 includes a plurality of data lines 22 and a plurality of scanning lines 21. The data line 22 and the scanning line 21 intersect with each other to define a plurality of sub-pixel areas 9. The data lines 22 are located at one side of the scanning lines 21 away from the base substrate 1. The extending directions and the arranging directions of the data lines 22 and the scanning lines 21 may be of various designs.

Figure 4:
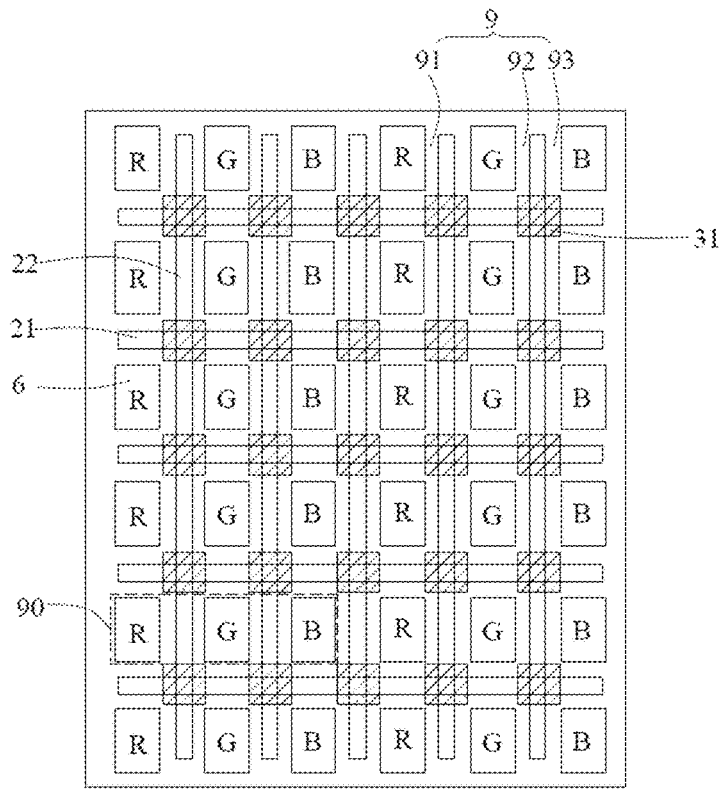
FIG. 4 is a schematic diagram of a planar structure of an array substrate in an exemplary embodiment of the present disclosure.

As shown in FIG. 4, in an embodiment, the plurality of data lines 22 extend along a column direction and are arranged at intervals along a row direction, and the plurality of scanning lines 21 extend along the row direction and are arranged at intervals along the column direction. It should be illustrated herein that in the present disclosure, the row direction and the column direction are relative to each other, and the intersection angle of the row direction and the column direction may be greater than 0°, and less than or equal to 90°.

Figure 7:
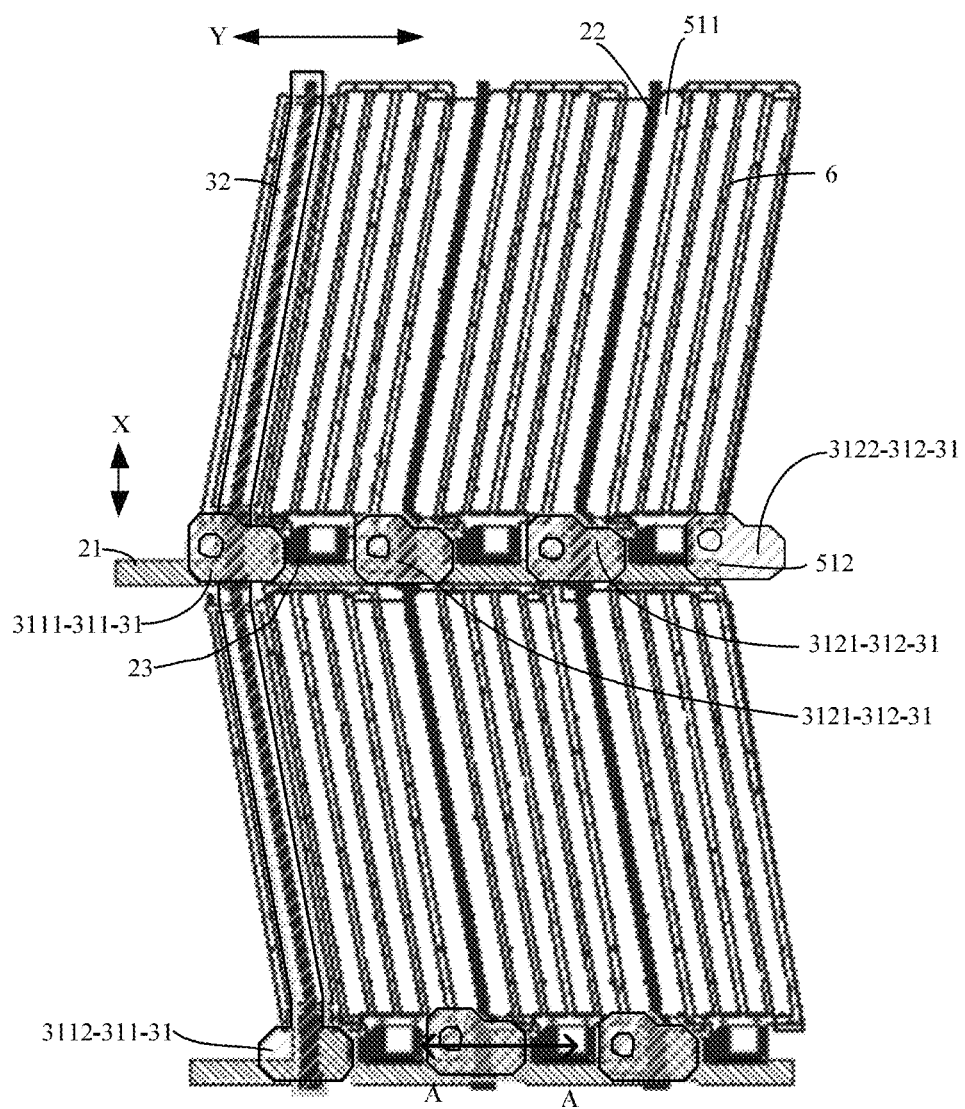
FIG. 7 is a schematic diagram of a local planar structure of an array substrate in an exemplary embodiment of the present disclosure.

As shown in FIG. 7, in a specific embodiment, the plurality of data lines 22 extend along the first direction X and are arranged at intervals along the second direction Y, the first direction X intersects with the second direction Y, and the intersection angle is greater than 0°, and less than or equal to 90°. The plurality of scanning lines 21 extend along the second direction Y and are arranged at intervals along the first direction X. In a specific embodiment, the first direction X is perpendicular to the second direction Y.

The scanning line 21 and the data line 22 may be single-layer conductive materials or stacks of multi-layers conductive materials. For example, in an embodiment of the present disclosure, the scanning line 21 may include a first conductive material layer, a second conductive material layer and a first conductive material layer that are stacked sequentially, i.e., presenting a sandwich structure. In some embodiments, the first conductive material layer may be selected from a corrosion-resistant metal or alloy, such as molybdenum; the second conductive material layer may be selected from a metal or alloy with high electrical conductivity, such as copper, aluminum, silver, and the like. For another example, in another embodiment of the present disclosure, the scanning line 21 may include a single-layer conductive material, for example, the material of the scanning line 21 may be molybdenum. The data line 22 may include the same conductive material as the scanning line 21.

As shown in FIGS. 1, 2, 7, and 8, in some embodiments, the driving circuit layer 2 further includes a gate layer 24 located at one side of the base substrate 1, and the scanning line 21 is arranged in a same layer as the gate layer 24. The gate layer includes a gate, and the scanning line 21 is connected to the gate and used for providing a scanning signal. The gate layer 24 may include a metal material or an alloy material to ensure its good electrical conductivity. Of course, the gate layer 24 may also be made of a transparent conductive material, such as indium tin oxide (ITO), indium zinc oxide (IZO), and the like.

The gate layer 24 and the scanning line 21 may be formed through a photolithography process, and the scanning line 21 and the gate layer 24 may be formed through the same photolithography process. For example, a conductive material layer may be deposited at one side of base substrate 1, and then the conductive material layer may be patterned to obtain the required scanning line 21 and gate layer 24.

The driving circuit layer 2 further includes a gate insulating layer 25 located at one side of the gate layer 24 away from the base substrate 1. The gate insulating layer 25 covers a surface of the gate layer 24. The gate insulating layer 25 may be a single-film layer such as silicon nitride, silicon oxide, aluminum oxide, or a multi-film layer formed by a combination thereof. The gate insulating layer 25 may be formed through a deposition method, for example, a silicon oxide layer may be formed as a gate insulating material layer through a vapor phase chemical deposition method, and the gate insulating material layer may be patterned to form the gate insulating layer 25.

The driving circuit layer 2 further includes an active layer 26 located at one side of the gate insulating layer 25 away from the base substrate 1. The material of the active layer 26 may be polycrystalline silicon or indium gallium zinc oxide (IGZO), and conductivity performances at different positions of the active layer 26 may be changed through processes such as doping.

The driving circuit layer 2 further includes a source-drain layer 23, and the source-drain layer 23 includes a source 23S covering one end of the active layer 26 and a drain 23D covering another end of the active layer 26. The data line 22 is arranged in a same layer as the source-drain layer 23. The data line 22 is connected to the drain 23D.

The gate layer 24, the gate insulating layer 25, the active layer 26, and the source-drain layer 23 may be used for forming a thin film transistor. The thin film transistor is located in the sub-pixel area 9 as a component structure of a pixel driving circuit to drive the liquid crystal pixel area.

In an embodiment, the driving circuit layer 2 further includes a planarization layer 27 located at one side of the source-drain layer 23 away from the base substrate 1. The planarization layer 27 covers a surface of the source-drain layer 23.

As shown in FIGS. 1, 2, 4, and 7, the metal layer 3 is located at one side of the driving circuit layer 2 away from the base substrate 1 and is located in the display area 11. The metal layer 3 includes a plurality of metal blocks 31 arranged at intervals. The metal block 31 is located at the intersection of the data line 22 and the scanning line 21. The plurality of metal blocks 31 may be arranged in a matrix array. Each of intersections of the data lines 22 and the scanning lines 21 is provided with a metal block 31.

Figure 8:
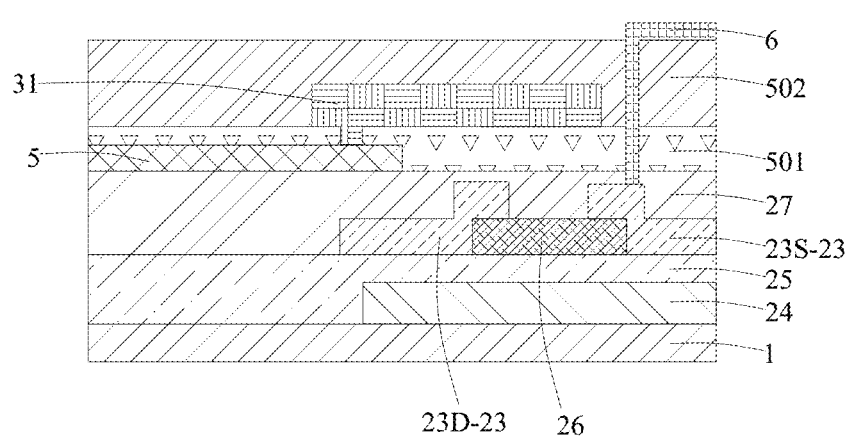
FIG. 8 is a cross-sectional view in the A-A direction in FIG. 7.

As shown in FIGS. 7 and 8, in some embodiments, an orthographic projection of the metal block 31 on the base substrate 1 covers a gap between orthographic projections, on the base substrate 1, of the source 23S and the drain 23D. That is, there is a gap between the orthographic projections, on the base substrate 1, of the source 23S and the drain 23D, and the orthographic projection of the metal block 31 on the base substrate 1 is partially located within the gap and covers the gap.

As shown in FIG. 7, in some embodiments of the present disclosure, the metal layer 3 further includes a plurality of touch control signal lines 32, an orthographic projection of the touch control signal line 32 on the base substrate 1 is located outside of an orthographic projection of the sub-pixel area 9 on the base substrate 1, and the orthographic projection of the touch control signal line 32 on the base substrate 1 at least partially overlaps with an orthographic projection of the data line 22 on the base substrate 1 to reduce the impact of the touch control signal line 32 on the pixel aperture ratio. The metal block 31 includes a touch control connecting metal piece 311 and a metal spacer piece 312. The touch control connecting metal piece 311 is connected to the touch control signal line 32. The metal spacer piece 312 is spaced apart from the touch control signal line 32. In a specific embodiment, the touch control connecting metal piece 311 is in direct contact with the touch control signal line 32 for connecting.

In the second direction Y, orthographic projections, on the base substrate 1, of a part of the data lines 22 are located within orthographic projections of the touch control signal lines 32 on the base substrate 1. That is, in the second direction Y, the width of the touch control signal line 32 is greater than the width of the data line 22 to reduce the common electrode voltage perturbation (vcom ripple). In a specific embodiment, in the second direction Y, the touch control signal line 32 has a width of 5.2-6.2 μm, and the data line 22 has a width of 2.5-3.5 μm.

In this embodiment, the touch control connecting metal piece 311, the metal spacer piece 312, and the touch control signal line 32 may be formed by using the same material and the same photolithography process. A metallic material layer may be formed by depositing at one side of the driving circuit layer 2 away from the base substrate 1, and then the metallic material layer may be patterned, thereby obtaining the required touch control connecting metal piece 311, metal spacer piece 312, and touch control signal line 32.

As shown in FIGS. 1, 2, and 6 to 8, in some embodiments of the present disclosure, the array substrate further includes a common electrode 5 and a plurality of pixel electrodes 6. The common electrode 5 is located at one side of the driving circuit layer 2 away from the base substrate 1, and the plurality of pixel electrodes 6 are located at one side of the common electrode 5 away from the base substrate 1. In an embodiment, a first passivation layer 501 and/or a second passivation layer 502 may be formed between the common electrode 5 and the pixel electrodes 6, and the pixel electrode 6 is connected to the source in the source-drain layer 23 through a via.

Figure 6:
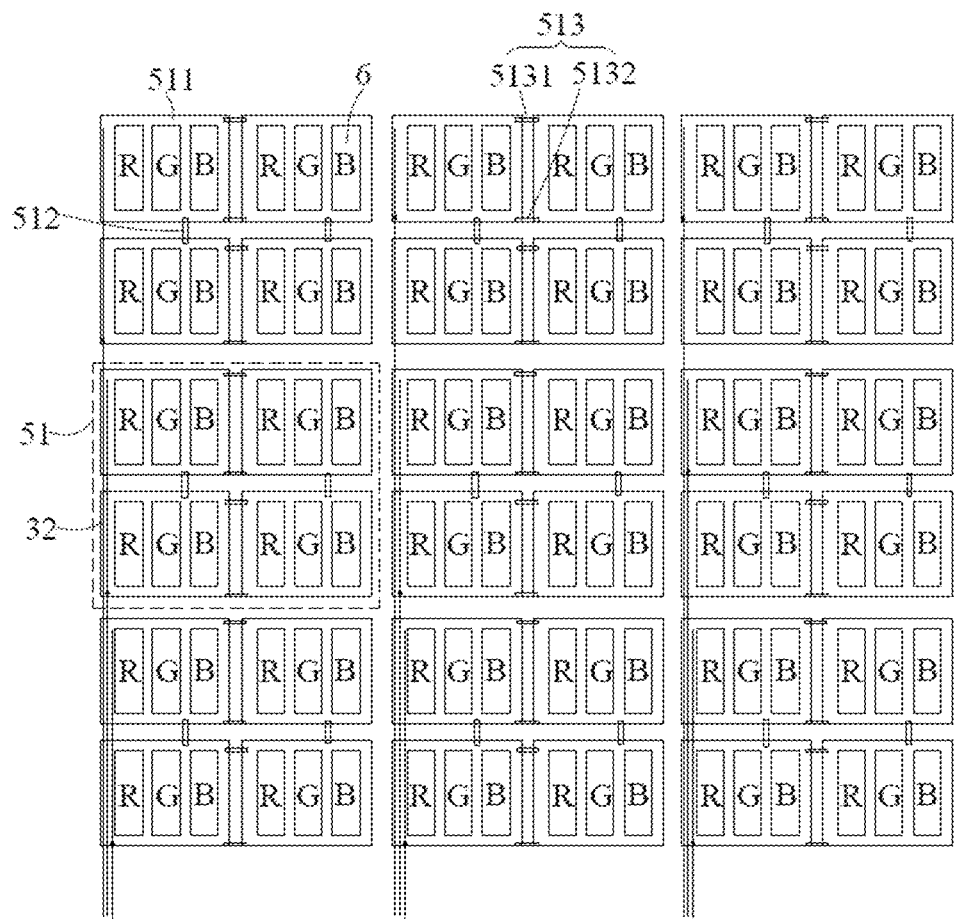
FIG. 6 is a schematic structural diagram of a common electrode in an exemplary embodiment of the present disclosure.

As shown in FIGS. 6 to 8, the common electrode 5 includes a plurality of touch control units 51 arranged at intervals, and the touch control unit 51 includes a plurality of interconnected common electrode blocks 511. The plurality of pixel electrodes 6 are located at one side of the common electrode 5 away from the base substrate 1. One pixel electrode 6 corresponds to one sub-pixel area 9.

In this embodiment, the common electrode 5 is used as a touch control electrode. In the related art, this principle may be used to fabricate a touch and display driver integration (TDDI) touch screen, integrating a touch control sensor into a display device and integrating a touch control chip and a display chip into a single chip to make the screen thinner, which meets the design requirement for thin display products.

As shown in FIG. 6, in this embodiment, the array substrate is provided with a plurality of touch control units 51 (self-capacitance electrodes) located in the same layer and insulated from each other. When a human body does not touch the screen, the capacitance of each touch control unit 51 is a fixed value, and when the human body touches the screen, the capacitance of the corresponding touch control unit 51 is the value formed by adding the fixed value to the human body capacitance. The touch control detection chip determines the touch control position by detecting the change in the capacitance value of the touch control units 51 during the touch control time period.

Figure 2:
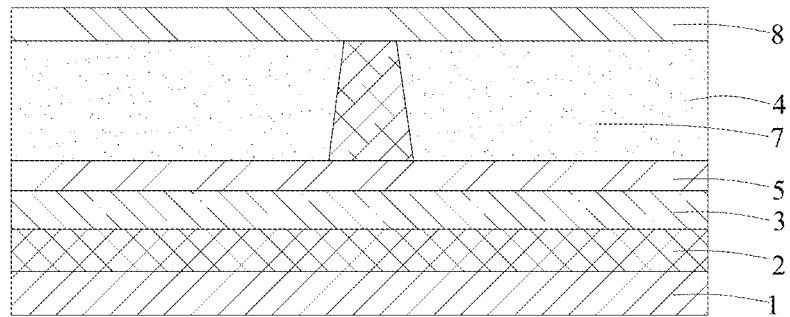
FIG. 2 is a schematic diagram of a cross-section of a display panel in another exemplary embodiment of the present disclosure.

As shown in FIGS. 1 and 2, the metal layer 3 is located at one side of the driving circuit layer 2 away from the base substrate 1. In an embodiment, the metal layer 3 is located at one side of the common electrode 5 away from the base substrate 1 (FIG. 1). In another embodiment, the metal layer 3 may be located at one side of the common electrode 5 close to the base substrate 1 (FIG. 2).

As shown in FIG. 7, the metal block 31 includes the touch control connecting metal piece 311 and the metal spacer piece 312. In some embodiments, the touch control connecting metal piece 311 includes a first touch control metal piece 3111 and a second touch control metal piece 3112. The touch control signal line 32 is connected through the first touch control metal piece 3111 to one of the common electrode blocks 511 in the touch control unit 51, in order that the capacitance value of the touch control unit 51 may be transmitted through the touch control signal line 32 to the touch control detection chip, which enables the touch control detection chip to accurately determine the capacitance electrode that is touched and react accordingly. The second touch control metal piece 3112 is not connected to the common electrode block 511. The metal spacer piece 312 is spaced apart from the touch control signal line 32, that is, the metal spacer piece 312 is not directly connected to the touch control signal line 3. The metal spacer piece 312 is connected to the common electrode block 511 that is at a position corresponding to the metal spacer piece 312, causing that the voltage of the metal spacer piece 312 is equal to the voltage of the common electrode block 511, which avoids that the metal spacer piece 312 adversely affects the electric field due to floating.

When the metal layer 3 is located at one side of the common electrode 5 close to the base substrate 1, i.e., between the driving circuit layer 2 and the common electrode 5, the metal layer 3 may be formed first at one side of the driving circuit layer 2 away from the base substrate 1, followed by the formation of the passivation layer at one side of the metal layer 3 away from the base substrate 1, and the formation of a via through etching at a specific position of the formed passivation layer to expose the metal layer 3 at the specific position, and the common electrode 5 is formed at one side of the passivation layer away from the base substrate 1, at which time certain common electrode blocks 511 in the formed common electrode 5 may be connected to certain metal blocks 31 in the metal layer 3 through vias. The area of the via may be set to be 9-25 μm², and the shape of the orthographic projection of the via on the base substrate 1 may be generally a circle, an ellipse, an irregular polygon, or a regular polygon, etc., and the present disclosure does not make limitations to this.

When the metal layer 3 is located at one side of the common electrode 5 away from the base substrate 1, such as between the common electrode 5 and the pixel electrode 6 (FIG. 8), the common electrode 5 may be first formed at one side of the driving circuit layer 2 away from the base substrate 1, followed by the formation of the passivation layer 501 at one side of the common electrode 5 away from the base substrate 1, and the formation of a via through etching at a specific position of the formed passivation layer 501 to expose the common electrode 5 at the specific position, and the metal layer 3 is formed at one side of the passivation layer 501 away from the base substrate 1, at which time certain metal blocks 31 in the formed metal layer 3 may be connected to certain common electrode blocks 511 in the common electrode 5 through vias. The area of the via may be set to be 9-25 μm², and the shape of the orthographic projection of the via on the base substrate 1 may be generally a circle, an ellipse, an irregular polygon, or a regular polygon, etc., and the present disclosure does not make limitations to this.

Figure 11:
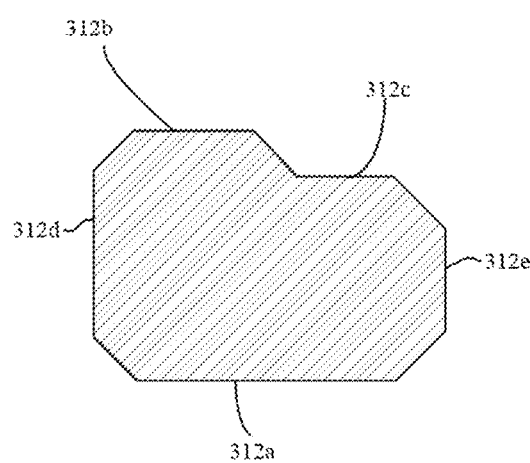
FIG. 11 is a schematic structural diagram of a metal spacer piece in an exemplary embodiment of the present disclosure.

As shown in FIGS. 7 and 11, in some embodiments of the present disclosure, the metal spacer piece 312 includes a first edge 312a, a second edge 312b and a third edge 312c connected in sequence, the second edge 312b and the third edge 312c are located at one side, along the first direction X, of the first edge 312a and are parallel to the first edge 312a, a distance between the second edge 312b and the first edge 312a is greater than a distance between the third edge 312c and the first edge 312a, and an orthographic projection, on the base substrate 1, of a connecting via of the metal spacer piece 312 and the common electrode block 511 is located between orthographic projections, on the base substrate 1, of the first edge 312a and the second edge 312b. In a specific embodiment, the first edge 312a, the second edge 312b and the third edge 312c are substantially parallel to the second direction Y, and the lengths of the second edge 312b and the third edge 312c are smaller than the length of the first edge 312a. Further, the metal spacer piece 312 further includes a fourth edge 312d and a fifth edge 312e located at two ends, in the second direction Y, of the first edge 312a. The fourth edge 312d and the fifth edge 312e are substantially perpendicular to the first edge 312a. The first edge 312a, the fourth edge 312d, the second edge 312b, the third edge 312c, and the fifth edge 312e are connected in sequence to form a closed figure.

As shown in FIGS. 7 and 11, in this embodiment, by increasing the distance between the second edge 312b and the first edge 312a, the region of the metal spacer piece 312 including the second edge 312b and the common electrode block 511 above the region form stacked areas, thereby facilitating the connection between the metal spacer piece 312 and the common electrode block 511.

Similarly, the shape design of the metal spacer piece 312 is also applicable to the first touch control metal piece 3111. As shown in FIG. 7, the first touch control metal piece 3111 may have the same shape as the metal spacer piece 312 when the first touch control metal piece 3111 is connected to the common electrode block 511. When the second touch control metal piece 3112 does not need to be connected to the common electrode block, the shape of the second touch control metal piece 3112 may be set according to actual needs. For example, the second touch control metal piece 3112 is a regular polygon, and an orthographic projection of the second touch control metal piece 3112 on the base substrate 1 is an axisymmetric regular polygon, such as a bilaterally symmetrical regular hexagon or octagon, etc. Further, the orthographic projection of the second touch control metal piece 3112 on the base substrate 1 may also be a regular polygon that is centrally symmetric. As shown in FIG. 7, in a specific embodiment, the second touch control metal piece is a bilaterally symmetrical regular octagon, and the second touch control metal piece 3112 has a dimension of 16-17 µm in the second direction Y, and has a dimension of 9.2-10.2 µm in the first direction X.

In a specific embodiment, the metal spacer piece 312 has a dimension of 16-17 µm in the second direction Y, the distance between the second edge 312b and the first edge 312a is 11.6-12.6 µm, and the distance between the third edge 312c and the first edge 312a is 9.2-10.2 µm.

As shown in FIGS. 6, 7, 9, and 10, in some embodiments of the present disclosure, the touch control unit 51 includes the plurality of common electrode blocks 511 arranged in an array, at least two of the common electrode blocks 511 are arranged along the first direction X to form a column, and at least two of the common electrode blocks 511 are arranged along the second direction Y to form a row. Two adjacent rows of the common electrode blocks 511 in the touch control unit 51 are connected to each other through a row connecting portion 512, and two adjacent columns of the common electrode blocks 511 in the touch control unit 51 are connected to each other through a column connecting portion 513. In some embodiments, the column connecting portion 513 includes an upper connecting part 5131 connected to an upper region of the common electrode block 511, and a lower connecting part 5132 connected to a lower region of the common electrode block. That is, the column connecting portion 513 between two adjacent common electrode blocks 511 includes the upper connecting part 5131 and the lower connecting part 5132 to ensure stability and firmness when the common electrode blocks 511 are connected. The row connecting portion 512 and the column connecting portion 513 are provided in a same layer as the common electrode blocks 511.

The size of the common electrode block 511 may be set according to the actual situation. For example, the size of the common electrode block 511 is set according to the number of sub-pixel areas 9 or pixel electrodes 6 to which the common electrode block 511 needs to correspond.

As shown in FIGS. 6 and 7, in some embodiments of the present disclosure, the sub-pixel areas 9 include a red sub-pixel area 91, a green sub-pixel area 92 and a blue sub-pixel area 93, at least one red sub-pixel area 91, at least one green sub-pixel area 92 and at least one blue sub-pixel area 93 are arranged to form a pixel unit region 90, and one pixel unit region 90 corresponds to one of the common electrode blocks 511. An orthographic projection of the row connecting portion 512 on the base substrate 1 is located between orthographic projections, on the base substrate 1, of two adjacent sub-pixel areas corresponding to the common electrode block 511.

In a specific embodiment, one red sub-pixel area 91, one green sub-pixel area 92 and one blue sub-pixel area 93 are sequentially arranged along the second direction Y to form one pixel unit region 90, and one common electrode block 511 corresponds to one pixel unit region 90. The orthographic projection of the row connecting portion 512 on the base substrate 1 is located between the orthographic projections, on the base substrate 1, of the green sub-pixel area 92 and the blue sub-pixel area 93 corresponding to the common electrode block 511.

In some embodiments of the present disclosure, the first touch control metal piece 3111 and the metal spacer piece 312 may be connected to the common electrode block 511 through different connecting positions, respectively.

Figure 9:
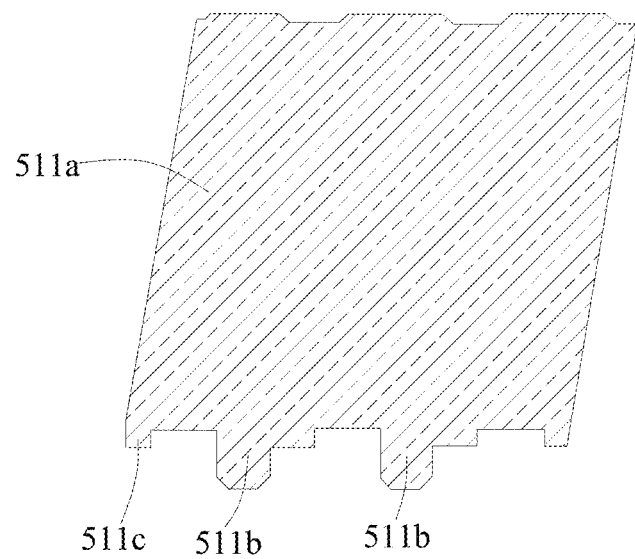
FIG. 9 is a schematic structural diagram of a common electrode block in an exemplary embodiment of the present disclosure.
Figure 10:
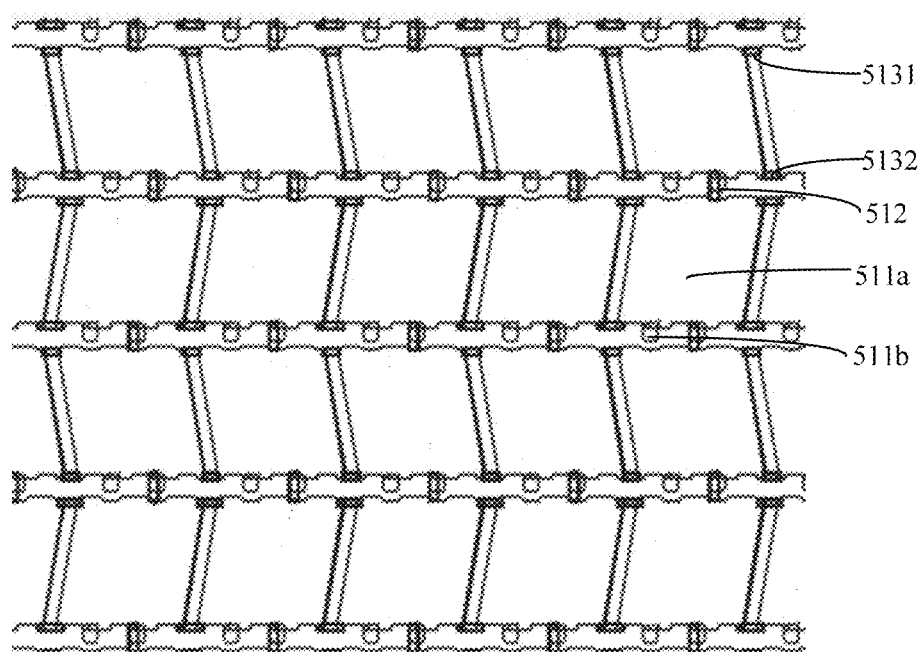
FIG. 10 is a schematic diagram of a connecting structure of a common electrode block in a touch control unit in an exemplary embodiment of the present disclosure.

As shown in FIGS. 9 and 10, in this embodiment, the common electrode block 511 includes a main body 511a, and a first protruding portion 511b and a second protruding portion 511c that are connected to one side of the main body 511a; the first protruding portion 511b is connected to a middle part of the side of the main body 511a, an orthographic projection of the first protruding portion 511b on the base substrate 1 is located between orthographic projections, on the base substrate 1, of two adjacent sub-pixel areas 9 corresponding to the common electrode block 511, and the second protruding portion 511c is connected to a corner of the main body 511a.

In some embodiments, the number of the first protruding portion 511b may be set according to the number of sub-pixel areas 9 corresponding to the common electrode block 511. For example, when the common electrode block 511 corresponds to three sub-pixel areas 9, the number of the first protruding portion 511b may be two, which are located correspondingly between two adjacent sub-pixel areas 9, respectively.

As shown in FIGS. 7, 9, and 10, the metal spacer piece 312 includes a first spacer 3121, an orthographic projection of the first spacer 3121 on the base substrate 1 at least partially overlaps with the first protruding portion 511b, and the first spacer 3121 is connected to the first protruding portion 511b through a via. In a specific embodiment, the number of the first protruding portion 511b is multiple, and the shapes and dimensions of different first protruding portions 511b may be the same or different. A part of first protruding portions 511b are used as the row connecting portion 512 when two adjacent rows of the common electrode blocks 511 are connected. For example, the first protruding portion 511b correspondingly located between the green sub-pixel area 92 and the blue sub-pixel area 93 is used as the row connecting portion 512. In this case, the dimension of this first protruding portion 511b may be set according to the distance between the two adjacent rows of the common electrode blocks 511.

In some embodiments, the number of the second protruding portion 511c is multiple, where the touch control connecting metal piece 311 is provided at a position corresponding to a part of the second protruding portions 511c, and the metal spacer piece 312 is provided at a position corresponding to a part of the second protruding portions 511c.

When the common electrode block 511 is provided with the touch control signal line 32 around the common electrode block 511, the touch control connecting metal piece 311 connected to the touch control signal line 32 may be provided at a position corresponding to the second protruding portion 511c of this common electrode block 511. In some embodiments, when the touch control signal line 32 needs to be connected to the common electrode block 511 through the first touch control metal piece 3111, an orthographic projection of the first touch control metal piece 3111 on the base substrate 1 at least partially overlaps with an orthographic projection, on the base substrate 1, of the second protruding portion 511c of the one of the common electrode blocks 511 in the touch control unit 51, and the first touch control metal piece 3111 is connected to the second protruding portion 511c through a via. When the common electrode block 511 is not provided with the touch control signal line 32 around the common electrode block 511, the metal spacer piece 312 may be provided at a position corresponding to the second protruding portion 511c of the common electrode block 511, the metal spacer piece 312 further includes a second spacer 3122, an orthographic projection of the second spacer 3122 on the base substrate 1 at least partially overlaps with the second protruding portion 511c, and the second spacer 3122 is connected to the second protruding portion 511c through a via.

Figure 3:
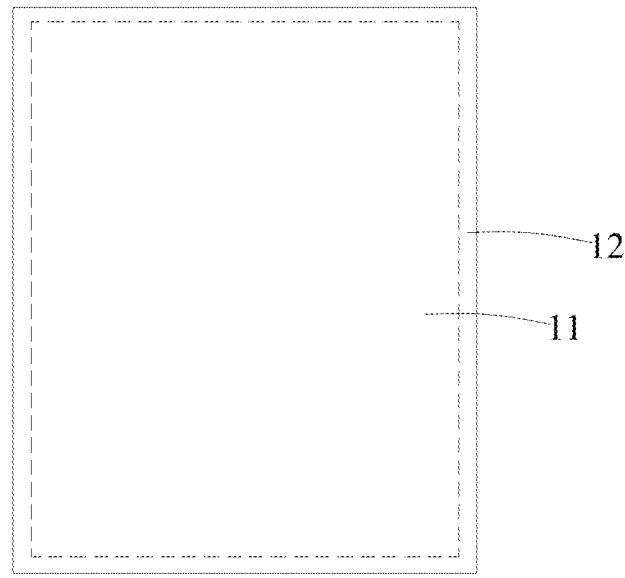
FIG. 3 is a schematic structural diagram of a base substrate in an exemplary embodiment of the present disclosure.
Figure 12:
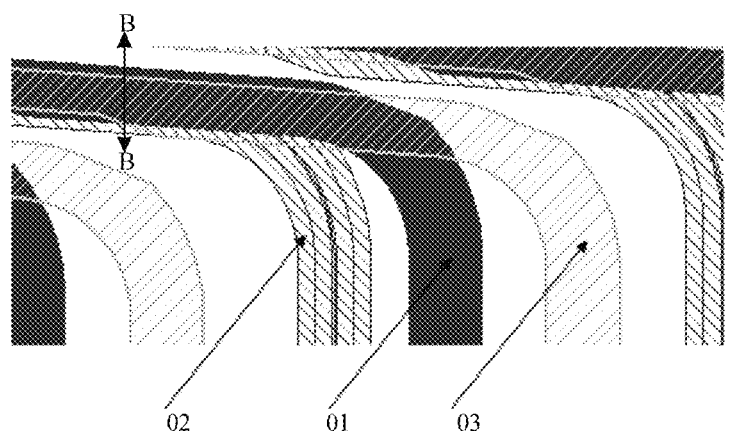
FIG. 12 is a schematic structural diagram of each lead in a peripheral area in an exemplary embodiment of the present disclosure.
Figure 13:
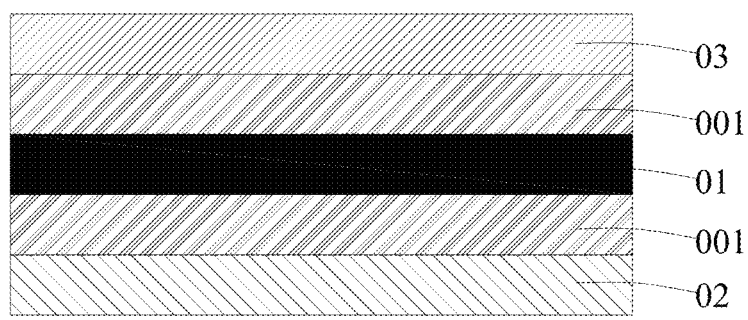
FIG. 13 is a cross-sectional view in the B-B direction in FIG. 12.

As shown in FIGS. 3, 12, and 13, in some embodiments of the present disclosure, the array substrate further includes a signal lead and a touch control lead 03 located in the peripheral area 12. The signal lead is located at one side of the base substrate 1 and is located in the peripheral area 12, where the signal lead includes a data lead 01 and a scanning lead 02, the data lead 01 is connected to the data line 22 and is arranged in a same layer as the data line 22, and the scanning lead 02 is arranged in a same layer as the scanning line 21; the touch control lead 03 is located at one side of the base substrate 1 and is located in the peripheral area 12, where the touch control lead 03 is connected to the touch control signal line 32 and is arranged in a same layer as the touch control signal line 32. In some embodiments, orthographic projections, on the base substrate 1, of the data lead 01, the scanning lead 02 and the touch control lead 03 at least partially overlap with each other.

In some embodiments, an insulating layer 001 is also provided between film layers of the data lead 01, the scanning lead 02 and the touch control lead 03. In this embodiment, the three layers of the data lead 01, the scanning lead 02, and the touch control lead 03 are overlapped, which is conducive to reducing the width of the fan-shaped area, and realizing a narrow bezel design for the array substrate in this area. At the same time, the three layers of leads are stacked and are kept insulated from each other through the insulating layer 001, which can effectively reduce the risk of short-circuiting of the leads from each other. The line widths of the data lead 01, the scanning lead 02 and the touch control lead 03 may be set according to the actual situation. In a specific embodiment, the line widths of the data lead 01, the scanning lead 02 and the touch control lead 03 may be 2.7 µm, and when the three layers are in the same layer, the line spacing may be 2.3 µm.

Figure 14:
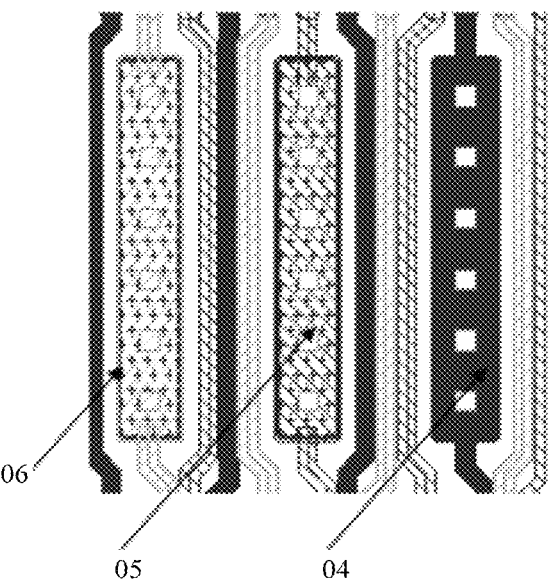
FIG. 14 is a schematic diagram of a planar structure of a pad in an exemplary embodiment of the present disclosure.
Figure 15:
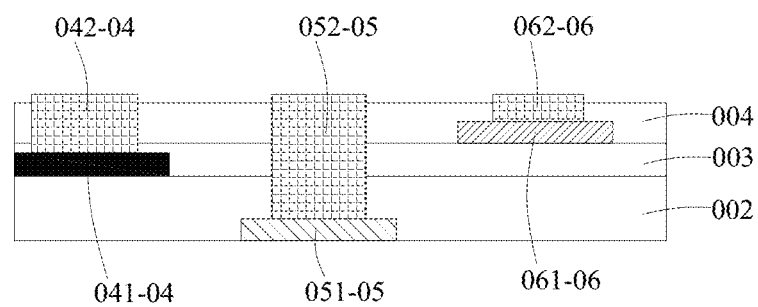
FIG. 15 is a cross-sectional view of a pad in an exemplary embodiment of the present disclosure.

As shown in FIGS. 14 and 15, in some embodiments of the present disclosure, the peripheral area 12 further includes a binding zone. The peripheral lead is connected to the chip in this zone to achieve transmission of touch control and display signals. Each lead may be connected to the chip through an adapter hole.

The array substrate further includes a pad, the pad is located at one side of the base substrate 1 and is located in the binding zone, and the pad includes a first pad 04, a second pad 05 and a third pad 06. The first pad 04 is connected to the data lead 01, the first pad 04 includes a first conductive layer 041 and a second conductive layer 042, the first conductive layer 041 is arranged in the same layer as the data line 22, the second conductive layer 042 is arranged in the same layer as the pixel electrode 6, and the second conductive layer 042 is connected to the first conductive layer 041 through a via.

The second pad 05 is connected to the scanning lead 02, the second pad 05 includes a third conductive layer 051 and a fourth conductive layer 052, the third conductive layer 051 is arranged in the same layer as the scanning line 21, the fourth conductive layer 052 is arranged in the same layer as the pixel electrodes 6, and the fourth conductive layer 052 is connected to the third conductive layer 051 through a via.

The third pad 06 is connected to the touch control lead 03, the third pad 06 includes a fifth conductive layer 061 and a sixth conductive layer 062, the fifth conductive layer 061 is arranged in the same layer as the touch control signal line 32, the sixth conductive layer 062 is arranged in the same layer as the pixel electrode 6, and the sixth conductive layer 062 is connected to the fifth conductive layer 061 through a via.

Specifically in an embodiment, an insulating layer 002 is also provided between the third conductive layer 051 and the first conductive layer 041, and a passivation layer 003 is also provided between the third conductive layer 051 and the fifth conductive layer 061. A passivation layer 004 is provided at one side of the fifth conductive layer 061 away from the third conductive layer 051. The second conductive layer 042, the fourth conductive layer 052 and the sixth conductive layer 062 are provided at one side of the passivation layer 004 away from the fifth conductive layer 061 and the third conductive layer 051, and are connected to the first conductive layer 041, the third conductive layer 051 and the fifth conductive layer 061 through a via, respectively. The second conductive layer 042, the fourth conductive layer 052 and the sixth conductive layer 062 may be connected to the chip, thereby realizing the connection of each lead to the chip to complete the transmission of each signal.

Figure 5:
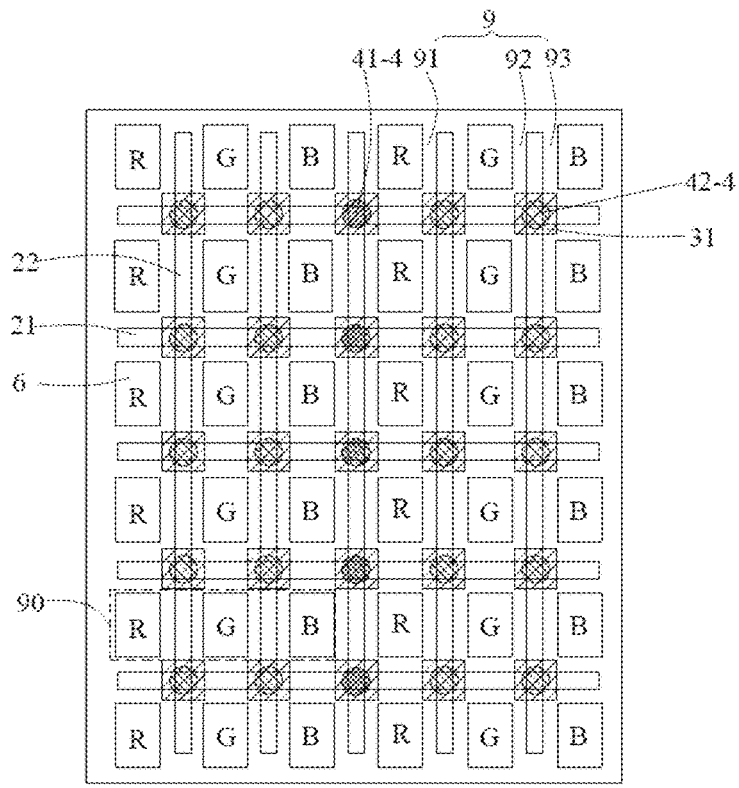
FIG. 5 is a schematic diagram of a plane of a display panel in an exemplary embodiment of the present disclosure.

As shown in FIGS. 1, 2, and 5, the present disclosure also provides a display panel including the array substrate in any of the above embodiments, and further including a color film substrate 8, a plurality of spacers 4, and a liquid crystal layer 7. The color film substrate 8 is located at one side of the array substrate. The plurality of spacers 4 are located between the array substrate and the color film substrate 8, the spacers 4 are in one-to-one correspondence with the metal blocks 31, and at least half of an orthographic projection, on the base substrate 1, of a top end (one end close to the array substrate) of the spacer 4 is located within an orthographic projection of the metal block 31 on the base substrate 1. That is, the metal block 31 may well support the spacer 4 and prevent the spacer 4 from shifting due to unstable support. A multi-dimensional electric field is generated between the pixel electrode 6 and the common electrode 5, which is used for driving the liquid crystal in the liquid crystal layer 7 to deflect, thereby controlling the light output of the liquid crystal display panel in that pixel region.

The display panel provided in the present disclosure includes the metal layer 3 and the spacer 4, where the metal layer 3 includes a plurality of metal blocks 31 arranged at intervals, the spacer 4 is located at one side of the metal layer 3 away from the base substrate 1, and the orthographic projection of the spacer 4 on the base substrate 1 is located within the orthographic projection of the metal block 31 on the base substrate 1, thereby enabling the metal block 31 to stably support the spacer 4, and enabling the spacers 4 to maintain uniformity in height.

Figure 16:
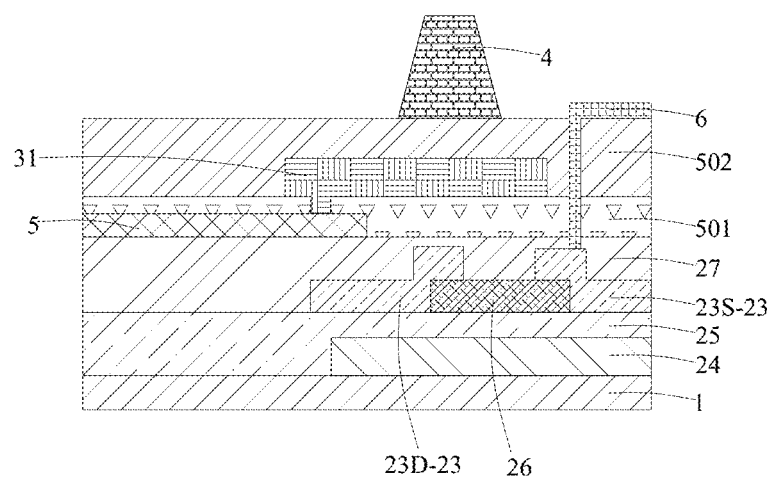
FIG. 16 is a cross-sectional view of a spacer on an array substrate in an exemplary embodiment of the present disclosure.
Figure 17:
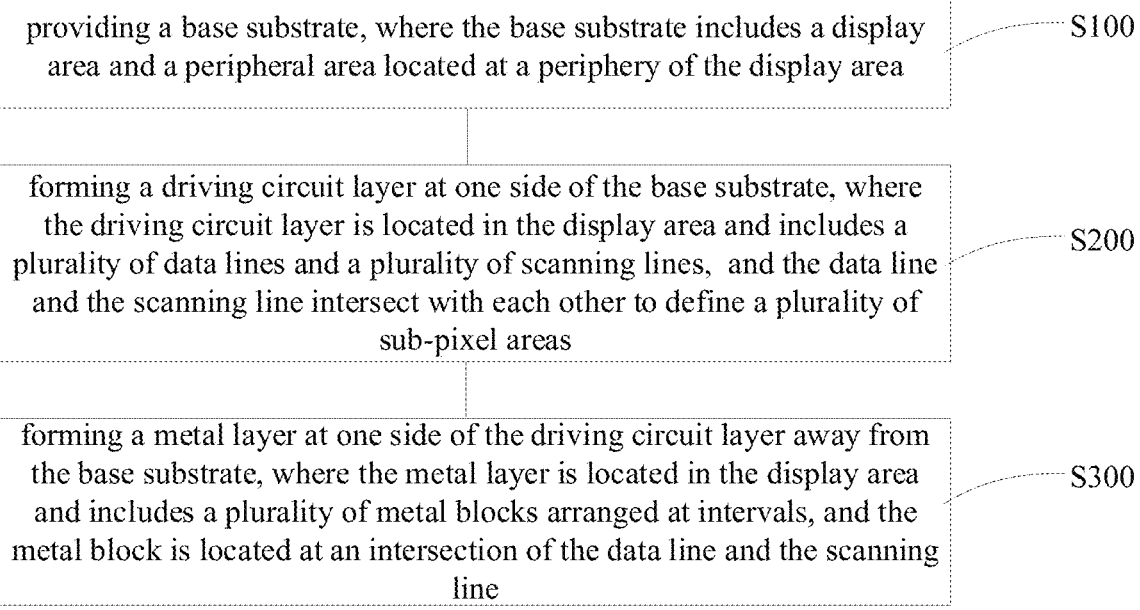
FIG. 17 is a flow diagram of a manufacturing method for an array substrate in an exemplary embodiment of the present disclosure.

As shown in FIG. 16, in some embodiments, the orthographic projection of the spacer 4 on the base substrate 1 partially overlaps with a gap between orthographic projections, on the base substrate 1, of the source 23S and the drain 23D. That is, there is a gap between the orthographic projections, on the base substrate 1, of the source 23S and the drain 23D, and a part of the area of the orthographic projection of the spacer 4 on the base substrate 1 overlaps with the gap.

The spacer 4 includes a main spacer part 41 and a secondary spacer part 42, the main spacer part 41 serves to control the cell thickness, and the secondary spacer part 42 serves as an auxiliary support and adjustment. The main spacer part 41 and the secondary spacer part 42 may be arranged in a certain regular pattern.

As shown in FIGS. 5 and 7, in some embodiments of the present disclosure, an orthographic projection of the main spacer part 41 on the base substrate 1 is located between orthographic projections, on the base substrate 1, of the red sub-pixel area 91 and the blue sub-pixel area 93. In practical applications, when the array substrate or the like is squeezed, the main spacer part 41 may be shifted under external force, thereby affecting the display of sub-pixels in adjacent areas. Typically, the transmittance rates of the red sub-pixels and the blue sub-pixels are lower than those of the green sub-pixels, therefore, the present disclosure sets the main spacer part 41 between the red sub-pixel area 91 and the blue sub-pixel area 93 to reduce the effect on the display effect when the main spacer part 41 is shifted. The setting position of the secondary spacer part 42 may be set according to actual design requirements, and may be located between any two sub-pixel areas 9.

Correspondingly, the orthographic projection of the touch control signal line 32 on the base substrate 1 is located between the orthographic projections, on the base substrate 1, of the red sub-pixel area 91 and the blue sub-pixel area 93. That is, the touch control signal line 32 is also provided between the red sub-pixel area 91 and the blue sub-pixel area 93.

As shown in FIGS. 1 to 4 and FIG. 17, the present disclosure also provides a manufacturing method for an array substrate, and the method includes steps S100 to S300.

At step S100, a base substrate 1 is provided, where the base substrate 1 includes a display area 11 and a peripheral area 12 located at a periphery of the display area 11;

At step S200, a driving circuit layer 2 is formed at one side of the base substrate 1, where the driving circuit layer 2 is located in the display area 11 and includes a plurality of data lines 22 and a plurality of scanning lines 21, the plurality of data lines 22 extend along the first direction X and are arranged at intervals along the second direction Y, the plurality of scanning lines 21 extend along the second direction Y and are arranged at intervals along the first direction X, the second direction Y intersects with the first direction X, and the data line 22 and the scanning line 21 intersect with each other to define a plurality of sub-pixel areas 9.

At step S300, a metal layer 3 is formed at one side of the driving circuit layer 2 away from the base substrate 1, where the metal layer 3 is located in the display area 11, the metal layer 3 includes a plurality of metal blocks 31 arranged at intervals, and the metal block 31 is located at an intersection of the data line 22 and the scanning line 21.

As shown in FIG. 8, in some embodiments of the present disclosure, forming the driving circuit layer 2 at one side of the base substrate 1 includes:

forming a gate layer 24 and the scanning line 21 at one side of the base substrate 1, where the scanning line 21 is arranged in the same layer as the gate layer 24, the gate layer 24 includes a gate, and the scanning line 21 is connected to the gate;

forming a gate insulating layer 25 at one side of the gate layer 24 away from the base substrate 1, where the gate insulating layer 25 covers a surface of the gate layer 24;

forming an active layer 26 at one side of the gate insulating layer 25 away from the base substrate 1;

forming a source-drain layer 23 at one side of the active layer 26 away from the base substrate 1, where the source-drain layer 23 covers two ends of the active layer 26, the data line 22 is arranged in the same layer as the source-drain layer 23, the source-drain layer 23 includes a source/drain, and the data line 22 is connected to the source/drain.

An embodiment of the present disclosure also provides a display device including a display panel, the display panel may be the display panel of any of the above embodiments, and the specific structure and beneficial effects thereof may be referred to the above embodiments of the display panel, and will not be repeated herein. The display device of the present disclosure may be an electronic device such as a mobile phone, a tablet computer, a television, and so on, and will not be enumerated herein.

It should be illustrated that although the steps of the method in the present disclosure are described in a particular order in the accompanying drawings, it is not required or implied that the steps must be performed in that particular order or that all of the steps shown must be performed in order to achieve the desired results. Additionally or alternatively, certain steps may be omitted, multiple steps may be combined into one step for execution, and/or one step may be decomposed into multiple steps for execution, etc., all of which should be considered as a part of the present disclosure.

It should be understood that the present disclosure does not limit its application to the detailed structure and arrangement of the components presented in this specification. The present disclosure is capable of being provided with other embodiments and being implemented and performed in a variety of ways. The foregoing deformed and modified forms fall within the scope of the present disclosure. It should be understood that the present disclosure, as disclosed and limited in this specification, extends to all alternative combinations of two or more individual features mentioned or apparent in the text and/or in the accompanying drawings. All of these various combinations constitute a plurality of alternative aspects of the present disclosure. The embodiments of this specification illustrate the best ways known for implementing the present disclosure and will enable those skilled in the art to utilize the present disclosure.

What is claimed is:

1. An array substrate, comprising:
a base substrate, comprising a display area and a peripheral area located at a periphery of the display area;
a driving circuit layer, located at one side of the base substrate, and located in the display area, wherein the driving circuit layer comprises a plurality of data lines and a plurality of scanning lines, the plurality of data lines extend along a first direction and are arranged at intervals along a second direction, the plurality of scanning lines extend along the second direction and are arranged at intervals along the first direction, the second direction intersects with the first direction, and the data lines and the scanning lines intersect with each other to define a plurality of sub-pixel areas;
a metal layer, located at one side of the driving circuit layer away from the base substrate, and located in the display area, wherein the metal layer comprises a plurality of metal blocks arranged at intervals, and the metal blocks are located at intersections of the data lines and the scanning lines; and
a common electrode, located at the side of the driving circuit layer away from the base substrate, wherein the common electrode comprises a plurality of touch control units arranged at intervals, and any one of the touch control units comprises a plurality of interconnected common electrode blocks; wherein
the metal layer further comprises a plurality of touch control signal lines, any one of the metal blocks comprises a touch control connecting metal piece and a metal spacer piece, the touch control connecting metal piece is connected to a touch control signal line in the touch control signal lines, and the metal spacer piece is spaced apart from the touch control signal lines; and
the metal spacer piece is connected to a common electrode block in the common electrode blocks through a via, the metal spacer piece comprises a first edge, a second edge and a third edge connected in sequence, the second edge and the third edge are located at one side, along the first direction, of the first edge and are parallel to the first edge, a distance between the second edge and the first edge is greater than a distance between the third edge and the first edge, and an orthographic projection, on the base substrate, of the via for connecting the metal spacer piece and the common electrode block is located between orthographic projections, on the base substrate, of the first edge and the second edge.

2. The array substrate according to claim 1, wherein orthographic projections of the touch control signal lines on the base substrate are located outside of orthographic projections of the sub-pixel areas on the base substrate, and the orthographic projections of the touch control signal lines on the base substrate at least partially overlap with orthographic projections of the data lines on the base substrate.

3. The array substrate according to claim 2, wherein the array substrate further comprises:
a plurality of pixel electrodes, located at one side of the common electrode away from the base substrate; wherein
the metal layer is located between the driving circuit layer and the common electrode, or is located at the side of the common electrode away from the base substrate; and
the touch control connecting metal piece comprises a first touch control metal piece and a second touch control metal piece, wherein any one of the touch control signal lines is connected through the first touch control metal piece to one of the common electrode blocks in the touch control units, and the second touch control metal piece is not connected to the common electrode blocks.

4. The array substrate according to claim 3, wherein any one of the touch control units comprises the plurality of common electrode blocks arranged in an array, at least two of the common electrode blocks are arranged along the first direction to form a column, and at least two of the common electrode blocks are arranged along the second direction to form a row;
two adjacent rows of the common electrode blocks in any one of the touch control units are connected to each other through a row connecting portion, and two adjacent columns of the common electrode blocks in any one of the touch control units are connected to each other through a column connecting portion; and
the column connecting portion comprises an upper connecting part connected to an upper region of the two adjacent columns of the common electrode blocks, and a lower connecting part connected to a lower region of the two adjacent columns of the common electrode blocks.

5. The array substrate according to claim 4, wherein the sub-pixel areas comprise a red sub-pixel area, a green sub-pixel area and a blue sub-pixel area, at least one red sub-pixel area, at least one green sub-pixel area and at least one blue sub-pixel area are arranged along the second direction to form a pixel unit region, and one pixel unit region corresponds to one of the common electrode blocks; and
an orthographic projection of the row connecting portion on the base substrate is located between orthographic projections, on the base substrate, of two adjacent sub-pixel areas corresponding to the two adjacent rows of the common electrode blocks connected to the row connecting portion.

6. The array substrate according to claim 5, wherein any one of the common electrode blocks comprises a main body, and a first protruding portion and a second protruding portion that are connected to one side of the main body; the first protruding portion is connected to a middle part of the side of the main body, an orthographic projection of the first protruding portion on the base substrate is located between orthographic projections, on the base substrate, of two adjacent sub-pixel areas corresponding to the any one of the common electrode blocks, and the second protruding portion is connected to a corner of the main body;
the metal spacer piece comprises a first spacer, wherein an orthographic projection of the first spacer on the base substrate at least partially overlaps with the orthographic projection of the first protruding portion on the base substrate, and the first spacer is connected to the first protruding portion through a via;
a number of the first protruding portion is multiple, and a part of first protruding portions are used as the row connecting portion; and
an orthographic projection of the first touch control metal piece on the base substrate at least partially overlaps with an orthographic projection, on the base substrate, of the second protruding portion of the one of the common electrode blocks in the touch control units, and the first touch control metal piece is connected to the second protruding portion through a via.

7. The array substrate according to claim 5, wherein any one of the orthographic projections of the touch control signal lines on the base substrate is located between orthographic projections, on the base substrate, of the red sub-pixel area and the blue sub-pixel area.

8. The array substrate according to claim 3, wherein the metal spacer piece has a dimension of 16-17 µm in the second direction, the distance between the first edge and the second edge is 11.6-12.6 µm, and the distance between the first edge and the third edge is 9.2-10.2 µm.

9. The array substrate according to claim 2, wherein in the second direction, orthographic projections, on the base substrate, of a part of the data lines are located within orthographic projections of the touch control signal lines on the base substrate.

10. The array substrate according to claim 9, wherein in the second direction, any one of the touch control signal lines has a width of 5.2-6.2 µm, and any one of the data lines has a width of 2.5-3.5 µm.

11. The array substrate according to claim 2, wherein the array substrate further comprises:
a signal lead, located at the side of the base substrate, and located in the peripheral area, wherein the signal lead comprises a data lead and a scanning lead, the data lead is connected to the data lines and is arranged in a same layer as the data lines, and the scanning lead is arranged in a same layer as the scanning lines; and
a touch control lead, located at the side of the base substrate, and located in the peripheral area, wherein the touch control lead is connected to the touch control signal lines and is arranged in a same layer as the touch control signal lines; wherein
orthographic projections, on the base substrate, of the data lead, the scanning lead and the touch control lead at least partially overlap with each other.

12. The array substrate according to claim 11, wherein the peripheral area comprises a binding zone; and the array substrate further comprises:
a pad, located at the side of the base substrate, and located in the binding zone, wherein the pad comprises a first pad, a second pad and a third pad; wherein
the first pad is connected to the data lead, the first pad comprises a first conductive layer and a second conductive layer, wherein the first conductive layer is arranged in the same layer as the data lines, the second conductive layer is arranged in a same layer as the pixel electrodes, and the second conductive layer is connected to the first conductive layer through a via;
the second pad is connected to the scanning lead, the second pad comprises a third conductive layer and a fourth conductive layer, wherein the third conductive layer is arranged in the same layer as the scanning lines, the fourth conductive layer is arranged in the same layer as the pixel electrodes, and the fourth conductive layer is connected to the third conductive layer through a via; and
the third pad is connected to the touch control lead, the third pad comprises a fifth conductive layer and a sixth conductive layer, wherein the fifth conductive layer is arranged in the same layer as the touch control signal lines, the sixth conductive layer is arranged in the same layer as the pixel electrodes, and the sixth conductive layer is connected to the fifth conductive layer through a via.

13. The array substrate according to claim 1, wherein the driving circuit layer further comprises:
a gate layer, located at the side of the base substrate, wherein the scanning lines are arranged in a same layer as the gate layer, the gate layer comprises a gate, and the scanning lines are connected to the gate;
a gate insulating layer, located at one side of the gate layer away from the base substrate, wherein the gate insulating layer covers a surface of the gate layer;
an active layer, located at one side of the gate insulating layer away from the base substrate; and
a source-drain layer, comprising a source covering one end of the active layer, and a drain covering another end of the active layer, wherein the data lines are arranged in a same layer as the source-drain layer, and the data lines are connected to the drain.

14. The array substrate according to claim 13, wherein an orthographic projection of any one of the metal blocks on the base substrate covers a gap between orthographic projections, on the base substrate, of the source and the drain.

15. A display panel, comprising:
the array substrate according to claim 13;
a color film substrate, located at one side of the array substrate;
a plurality of spacers, located between the array substrate and the color film substrate, wherein the spacers are in one-to-one correspondence with the metal blocks, and at least half of an orthographic projection, on the base substrate, of a top end of any one of the spacers is located within an orthographic projection of one of the metal blocks on the base substrate; and
a liquid crystal layer, located between the array substrate and the color film substrate; wherein
an orthographic projection of the spacer on the base substrate partially overlaps with a gap between orthographic projections, on the base substrate, of the source and the drain.

16. A display panel, comprising:
the array substrate according to claim 1;
a color film substrate, located at one side of the array substrate;
a plurality of spacers, located between the array substrate and the color film substrate, wherein the spacers are in one-to-one correspondence with the metal blocks, and at least half of an orthographic projection, on the base substrate, of a top end of any one of the spacers is located within an orthographic projection of one of the metal blocks on the base substrate; and
a liquid crystal layer, located between the array substrate and the color film substrate.

17. The display panel according to claim 16, wherein the sub-pixel areas comprise a red sub-pixel area, a blue sub-pixel area and a green sub-pixel area; any one of the spacers comprises a main spacer part, and an orthographic projection of the main spacer part on the base substrate is located between orthographic projections, on the base substrate, of the red sub-pixel area and the blue sub-pixel area.

18. A manufacturing method for an array substrate, comprising:
providing a base substrate, wherein the base substrate comprises a display area and a peripheral area located at a periphery of the display area;
forming a driving circuit layer at one side of the base substrate, wherein the driving circuit layer is located in the display area and comprises a plurality of data lines and a plurality of scanning lines, the plurality of data lines extend along a first direction and are arranged at intervals along a second direction, the plurality of scanning lines extend along the second direction and are arranged at intervals along the first direction, the second direction intersects with the first direction, and the data lines and the scanning lines intersect with each other to define a plurality of sub-pixel areas;

forming a metal layer at one side of the driving circuit layer away from the base substrate, wherein the metal layer is located in the display area and comprises a plurality of metal blocks arranged at intervals, and the metal blocks are located at intersections of the data lines and the scanning lines; and forming a common electrode at the side of the driving circuit layer away from the base substrate, wherein the common electrode comprises a plurality of touch control units arranged at intervals, and any one of the touch control units comprises a plurality of interconnected common electrode blocks; wherein the metal layer further comprises a plurality of touch control signal lines, any one of the metal blocks comprises a touch control connecting metal piece and a metal spacer piece, the touch control connecting metal piece is connected to a touch control signal line in the touch control signal lines, and the metal spacer piece is spaced apart from the touch control signal lines; and the metal spacer piece is connected to a common electrode block in the common electrode blocks through a via, the metal spacer piece comprises a first edge, a second edge and a third edge connected in sequence, the second edge and the third edge are located at one side, along the first direction, of the first edge and are parallel to the first edge, a distance between the second edge and the first edge is greater than a distance between the third edge and the first edge, and an orthographic projection, on the base substrate, of the via for connecting the metal spacer piece and the common electrode block is located between orthographic projections, on the base substrate, of the first edge and the second edge.

19. A display device, comprising a display panel, wherein the display panel comprises an array substrate, and the array substrate comprises:

a base substrate, comprising a display area and a peripheral area located at a periphery of the display area;

a driving circuit layer, located at one side of the base substrate, and located in the display area, wherein the driving circuit layer comprises a plurality of data lines and a plurality of scanning lines, the plurality of data lines extend along a first direction and are arranged at intervals along a second direction, the plurality of scanning lines extend along the second direction and are arranged at intervals along the first direction, the second direction intersects with the first direction, and the data lines and the scanning lines intersect with each other to define a plurality of sub-pixel areas;

a metal layer, located at one side of the driving circuit layer away from the base substrate, and located in the display area, wherein the metal layer comprises a plurality of metal blocks arranged at intervals, and the metal blocks are located at intersections of the data lines and the scanning lines; and a common electrode, located at the side of the driving circuit layer away from the base substrate, wherein the common electrode comprises a plurality of touch control units arranged at intervals, and any one of the touch control units comprises a plurality of interconnected common electrode blocks; wherein the metal layer further comprises a plurality of touch control signal lines, any one of the metal blocks comprises a touch control connecting metal piece and a metal spacer piece, the touch control connecting metal piece is connected to a touch control signal line in the touch control signal lines, and the metal spacer piece is spaced apart from the touch control signal lines; and the metal spacer piece is connected to a common electrode block in the common electrode blocks through a via, the metal spacer piece comprises a first edge, a second edge and a third edge connected in sequence, the second edge and the third edge are located at one side, along the first direction, of the first edge and are parallel to the first edge, a distance between the second edge and the first edge is greater than a distance between the third edge and the first edge, and an orthographic projection, on the base substrate, of the via for connecting the metal spacer piece and the common electrode block is located between orthographic projections, on the base substrate, of the first edge and the second edge.

* * * * *